(12) United States Patent
Hariguchi

(10) Patent No.: US 6,181,698 B1
(45) Date of Patent: Jan. 30, 2001

(54) NETWORK ROUTING TABLE USING CONTENT ADDRESSABLE MEMORY

(76) Inventor: Yoichi Hariguchi, 642 Homer St., Palo Alto, CA (US) 94301

( * ) Notice: Under 35 U.S.C. 154(b), the term of this patent shall be extended for 0 days.

(21) Appl. No.: 08/890,350

(22) Filed: Jul. 9, 1997

(51) Int. Cl.[7] ................................................. H04L 12/28
(52) U.S. Cl. ........................... 370/392; 370/422; 710/108
(58) Field of Search ................................... 370/389, 390, 370/391, 392, 395, 396, 422; 710/108

(56) References Cited

U.S. PATENT DOCUMENTS

| | | | | |
|---|---|---|---|---|
| 5,386,413 | * | 1/1995 | McAuley | 370/392 |
| 5,490,258 | | 2/1996 | Fenner | 395/401 |
| 5,521,910 | | 5/1996 | Matthews | 370/54 |
| 5,841,874 | * | 11/1998 | Kempke | 380/50 |

OTHER PUBLICATIONS

McAuley, A. et al., Fast routing table lookup using CAMs, IEEE, pp. 1382–1391, 1993.

* cited by examiner

*Primary Examiner*—Douglas W. Olms
*Assistant Examiner*—Ricardo M. Pizarro
(74) *Attorney, Agent, or Firm*—Lumen Intellectual Property Services

(57) ABSTRACT

A routing table comprises routing table entries [230], a word line driver [92], prioritizer [100], and memory [106]. Each routing table entry [230] comprises content addressable memory (CAM) cells [220] and an entry masking circuit. The routing table looks up in parallel an entry matching an input network address, and outputs the search result in deterministic time. Only the bits specified by the masking circuit in each entry are compared when searching. If multiple entries match the input, the prioritizer [100] uses mask information from the masking circuits of the matching entries to select the best entry, e.g. the entry having the most matching bits.

3 Claims, 13 Drawing Sheets

CAM cell

NETWORK ROUTING TABLE USING CONTENT ADDRESSABLE MEMORY

FIELD OF THE INVENTION

The present invention relates to routing tables, and to devices and methods for network routing, such as internet protocol (IP) routing. In particular, it relates to methods for quickly finding routing information in a routing table from a destination address.

BACKGROUND ART

In networking, the objective of routing is to quickly find from a given destination address a route and the related information about the route. This information is typically stored in a routing table. For example, in IP routing, a route is either:

an indirect route, in which case the next hop is another router. A routing table entry contains the next router's IP address and the related route information (such as the network interface to which it is connected);

a direct route, in which case the next hop is the destination host. A routing table entry contains the network interface to which the destination host is connected.

An IP address consists of 32 bits, plus an optional IP prefix. This prefix specifies the number of leading bits of the IP address which are considered the network portion, with the remaining bits being considered the host portion. The network portion is often referred to as the IP network address. The host portion could be referred to as the IP host address. The whole IP address, however, is sometimes called the IP host address to emphasize that it indicates the host address. For example, using standard Internet dotted decimal notation, 172.16.10.20/24 would indicate a network address of 172.16.10.0, while the full IP host address is 172.16.10.20.

IP routing is based on either the destination IP network address or the destination IP host address (i.e. the whole IP address). Routes specified with IP network addresses are called network routes. Routes specified with IP host addresses are called host routes. IP routers must handle both types of routes.

Routers use a table (or tables) called the routing table to find routes. The routing table consists of routing table entries. Each routing table entry typically contains information related to a destination, such as a next router's IP address for the destination, the destination network or host IP address, the IP prefix for the destination, and the network interface to be used for sending a datagram to the next router. [A datagram is a packet of information including an IP address header.] In case a routing table entry contains a direct route, the next router's IP address is 0.0.0.0 to indicate that it is a direct route.

The destination IP address in each IP datagram is used as the search key when routers look up a route. The problem is that each IP datagram is sent with its destination IP host address but not with its IP prefix information. Consequently, routers have to find which part of the IP host address consists of the IP network address in the case of a network route. Since network routes are much more common than host routes, this is a serious problem since it slows down the router and limits network speed.

There are two popular routing table implementations in the prior art.

The first uses hash tables. This approach is used in 4.2BSD UNIX, 4.3BSD UNIX, and some commercial routers.

Two routing tables and one special routing entry are used in this implementation. The first table, which we will refer to as rt_host, is used for host routes. The second table, which we will refer to as rt_net, is used for network routes. A special routing entry is used for the default route. When a datagram is being decoded, the router first tries to look up a route in the rt_host table for host routes. Then, if it cannot find a route in the rt_host table, it tries to look up a route in the rt_net table. Finally, it uses the default route (assuming the default route exists) if it cannot find any routes in either the rt_host or the rt_net tables.

These tables are implemented as hash tables. Routers use the destination IP host address in the incoming IP datagram as a hash key to determine the starting pointer of a linked list in the hash table. A linear search is then performed over a linked list to determine if the IP host address matches any entry in the linked list. If so, this entry (which contains the host route) is returned. In the case of the rt_net hash table, the linked list is pre-sorted by IP prefix in descending order so that the longest match of the network portion is selected.

This implementation is very slow because it is basically a linear search after calculating the starting pointer in the hash table. In addition, this route lookup cannot be done in deterministic time. That is, a router employing this method of look-up cannot always find a route within a fixed minimum amount of time. Consequently, networks using such routers cannot provide guaranteed or reliable performance and may experience unpredictable data flow problems.

Another popular implementation is the radix tree routing table. It is also known as the Patricia tree routing table. This is used in 4.4BSD UNIX, and some commercial routers. Some routers implement this by a hardware implementation.

This method takes the destination IP host address, and compares it one bit at a time going down in a binary tree of network and host IP addresses with back tracking. This tree can be sorted depending on the network and host IP addresses in the binary tree to optimize the search.

A radix tree search can minimize the number of bits to be tested to distinguish among a set of bit strings, but it cannot search for a route in deterministic time. It can also be slow if back tracking occurs.

In U.S. Pat. No. 5,386,413, all possible values to be compared with the incoming address are split into banks. Each bank uses a single mask in conjunction with the incoming address to select at most one associated output value in the bank. If more than one bank selects an output value, the value used is determined by the static priority of the banks. This method has the disadvantage of being inflexible and non-optimal. It also requires a separate bank for each set of different mask values. This arrangement can be inefficient and can waste valuable chip real estate since it is not known a priori how large each bank will need to be for a given router. Each router must therefore be built with large banks, most of which will be empty. If a bank fills up, the router fails to perform properly.

U.S. Pat. No. 5,521,910 discloses a breath first recursive search in parallel. It searches in parallel for the best path of multiple possible paths to the destination based on a relative ranking of the paths. This method, however, does not have mask values for the addresses and cannot select the most specific address among all possible addresses.

U.S. Pat. No. 5,490,258 uses a content addressable memory (CAM), which is also called an associative memory, for routing. But it uses CAM only for compressing the destination address, and the routing table itself is comprised of ordinary memory. Consequently, while the CAM helps compress information, it does not provide improved router look-up speed.

Some CAMs allow each entry to have different mask values. But none of them also return the mask value as well as the address for the entry found.

The paper "Fast Routing Table Lookup Using CAMs" by Anthony J. McAuley & Paul Francis, *Proc. IEEE INFOCOM*, 1993, discloses a routing method that requires different CAM banks for each mask value unless all entries are always kept sorted in order of largest to smallest mask. The burden of sorting addresses every time they change is an obvious disadvantage, and can degrade router performance. The use of different CAM banks also has the disadvantages already mentioned above.

OBJECTS AND ADVANTAGES OF THE INVENTION

Accordingly, several objects and advantages of the present invention are:
- to provide a routing table enabling deterministic look-up time.
- to provide a routing table enabling fast, parallel route look-up.
- to provide a simply structured routing table which makes efficient use of memory.
- to provide a routing table which is capable of selecting the most specific address match from among the routing table entries.

Other objects and advantages are to provide a high speed router capable of routing in deterministic time. Further objects and advantages of the present invention will become apparent from a consideration of the drawings and ensuing description.

BRIEF DESCRIPTION OF THE DRAWING FIGURES

Figure 1:
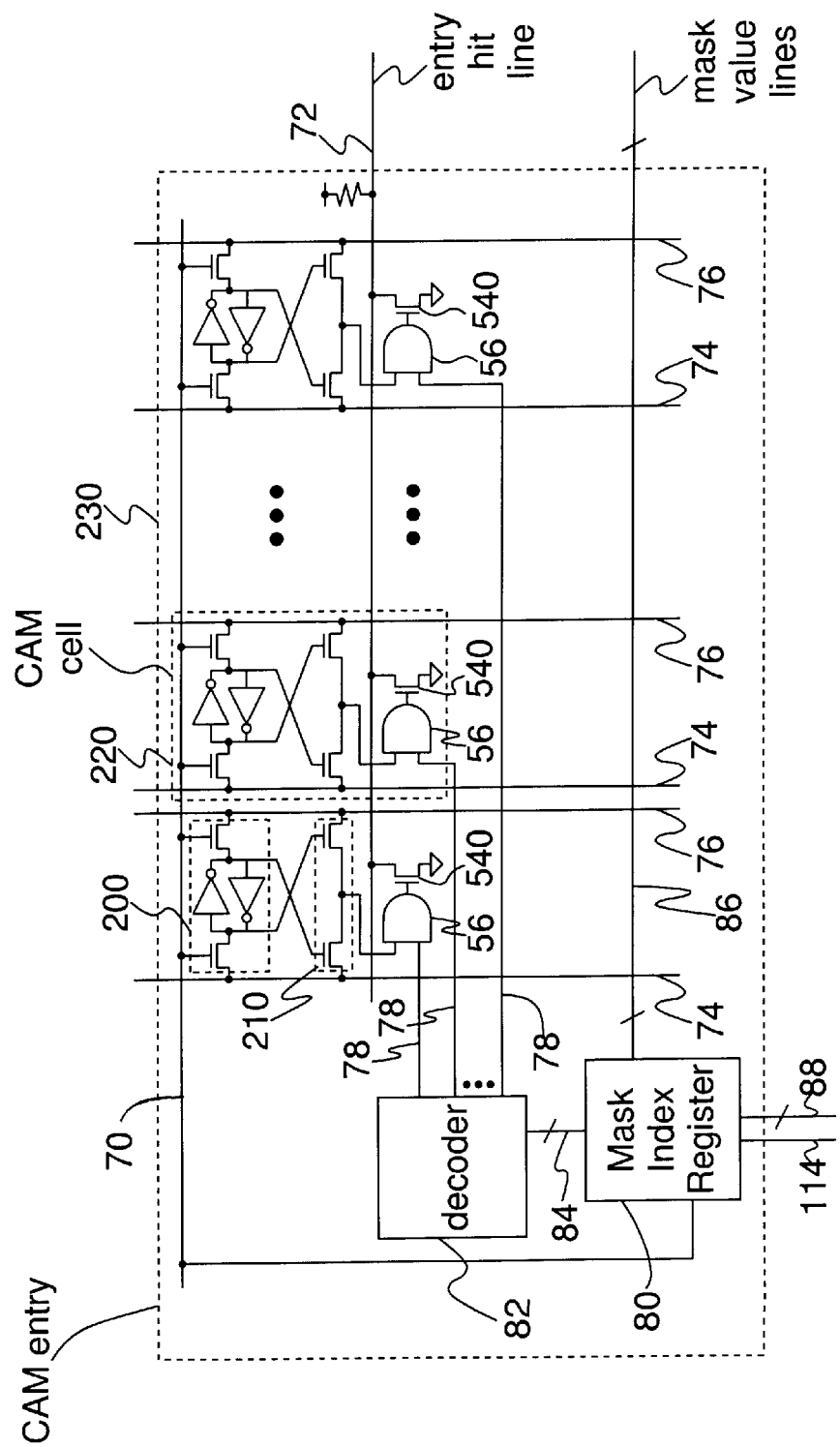
FIG. 1 shows the structure of an entry of a first CAM having a mask index register and a decoder for the masking circuit, according to the invention.

REFERENCE NUMBERS IN THE DRAWINGS 50 inverter
54 bit match output
56 AND gate
58 output of comparator 210
70 word line for CAM cells
72 entry hit line
74 positive bit line
76 negative bit line
78 masking control line
80 mask index register
82 decoder
84 mask value lines for decoder 82
86 mask value lines for prioritizer
88 mask value input line
90 entry address bus
92 word line driver
94 input/output line for memory cells
96 input/output amplifier
98 data enable line for CAM cells
100 prioritizer
102 hit entry address bus
104 hit line
106 memory for the associated routing table entry information
108 memory output
110 read/write control line for CAM cells
112 input/output line for memory cells
114 read/write control line for mask circuit
116 positive bit line for a mask memory cell
118 negative bit line for a mask memory cell
120 configuration/search control line
122 data enable line for memory cells
124 read/write control line for memory cells
126 entry address bus for configuration
128 mask register
130 multiplexer
140 three input AND
142 output line indicating data A is bigger
144 output line indicating data B is bigger
146 output line for encoding
148 enable signal for line 146
150 timing controller
152 comparator
154 compared result data output bus
156 compared result data valid signal
158 encoder
160 input data A valid signal
162 input data A data bus
164 input data B valid signal
166 input data B data bus
168 output enable
170 comparison circuit in comparator 152
172 output line indicating data A is bigger
174 output line indicating data B is bigger
200 memory cell for associated entry values
210 comparator
220 CAM cell
230 CAM entry with masking circuit comprising mask index register 80 and a decoder 82
232 CAM entry with masking circuit comprising mask register 128
234 CAM entry with masking circuit comprising mask memory cells 240

250 CHUM entry comprising memory cells 200 for storing associated entry values
300 input queue
302 output queue
304 header translator
306 incoming frame from the input of network interface
308 header input line
310 frame input bus
312 header output line
314 search key line
316 routing result line
320 routing table
322 ARP table
324 routing result generator
330 search key input line
332 routing table entry output line
334 AFP table entry output line
336 routing result output line
350 switching fabric
352 frame output bus
360 routing information bus to the routing engine
362 routing information bus from the routing engine
364 slow path processor
370 header manager
372 register for transmit mask
374 register for datalink layer destination address
376 register for datalink layer source address
378 resister for network layer protocol type
380 register for IP version and header length
382 register for TTL and header checksum
384 register for source IP address
386 register for destination IP address
388 register for the rest of header
390 header translator core
400 routing engine
500 MOS transistor
510 MOS transistor
520 MOS transistor
530 MOS transistor
540 MOS transistor

SUMMARY

The present invention provides a new routing table implemented by hardware, and a new CAM for implementing such a routing table. The present invention enables the routing table to look up a routing entry in parallel. The present invention also enables routing table lookup to finish in deterministic time. As the result, the present invention provides a high speed routing table.

The present invention provides a method and apparatus for searching for the most specific address among addresses which each have an associated mask value which may vary from address to address. Each entry has its own mask for determining which part of each entry value is used to compare with the incoming address in order to determine whether to select that entry's associated output value. Each mask value may vary from entry to entry If more than one entry matches the input destination address, prioritizer selects a single entry based on the mask values of the matched entries.

Each routing table entry has a destination network layer address (e.g., IP address in the Internet Protocol) and a mask value for the network layer address (netmask or IP prefix in the Internet Protocol). When a search key, which can be a destination network layer address, is input to the routing table, each routing table entry compares the following two values in parallel:

network layer address in the entry & mask value in the entry
search key & mask value in the entry
(Here, '&' means bitwise AND operation.)

Each routing table entry outputs the "hit" (match) information onto a hit line when the comparison of the above two values indicates a match. It outputs the "miss" (not match) information onto the hit line when the above two values do not match. Each entry also outputs its mask value onto the mask lines.

The hit line and mask lines of each entry are connected to a prioritizer. The prioritizer outputs the "miss" information when no entries output the "hit" information. It outputs the "hit" information and its entry address when only one entry outputs the "hit" information, or the "hit" information and an address of the entry based on priority of mask value (for example, the address of the entry which has the biggest mask value) if there are multiple "hits".

In one aspect of the invention, a content addressable memory (CAM) comprises a plurality of CAM entries, each of which comprises a plurality of CAM cells for storing data bits for the entry and for comparing the stored data bits with a search key. Each CAM entry further comprises a hit line for indicating a match between the search key and the stored data bits, and a masking circuit for masking an activation of the hit line in accordance with entry mask bits. The masking circuit is further characterized by the fact that it outputs the mask bits from the CAM to a prioritizer. The prioritizer is connected to the masking circuit of each memory entry, and produces the following output signals: if none of the hit lines is activated, a "no hit" signal; if only one of the hit lines is activated, a "hit" signal and a hit entry address; and if more than one of the hit lines is activated, a "hit" signal and a hit entry address selected in dependence upon the mask bits of entries corresponding the the activated hit lines. In one embodiment of the invention, the masking circuit of each CAM entry comprises an entry mask register for storing the entry mask bits for the entry. In another embodiment of the invention, the masking circuit of each CAM entry comprises a mask index register for storing an entry mask index value for the entry, and a decoder for producing from the entry mask index value the set of mask bits.

In another aspect of the invention, a routing table circuit is provided for determining from a destination address an associated table entry. The circuit comprises a plurality of routing table entries for determining in parallel a set of routing table entry hit addresses from the destination address, a prioritizer for selecting a single routing entry address from the set of table entry hit addresses, and a memory for producing the associated table entry from the single routing entry address. Each entry in the routing table comprises a collection of CAM cells for storing bits of a stored address, a masking circuit for masking a portion of the stored address bits in accordance with an address prefix for the stored address, and a mask output circuit for providing the address prefix to the prioritizer.

In another aspect of the invention, a method is provided for routing a data packet having a packet destination address. The method comprises the steps of producing an associated table entry for the destination from the packet destination address, determining from the packet destination address an associated table entry, and routing the packet in accordance with the associated table entry. The step of determining the associated table entry from the packet destination address comprises the substeps of determining a set of table entry hit addresses by applying the packet destination address to a collection of CAM cells that store a stored address and store an address prefix of the stored address, selecting a single entry address from the set of table entry hit addresses, and producing the associated table entry from the single entry address.

In yet another aspect of the invention, an apparatus is provided for routing a data packet having a packet destination address. The apparatus comprises a routing table circuit for determining from the packet destination address a next device identifier, and a switching fabric for routing the packet in accordance with the next device identifier. The routing table circuit comprises a plurality of routing table entries for determining in parallel a set of table entry hit addresses from the destination address, a prioritizer for selecting a single entry address from the set of table entry hit addresses, and a memory for producing the next device identifier from the single entry address. Each entry in the routing table comprises a collection of CAM cells for storing bits of a stored address, and a masking circuit for masking a portion of the stored address bits in accordance with an address prefix for the destination address.

DETAILED DESCRIPTION

FIG. 1 shows a content addressable memory (CAM) entry comprising a plurality of CAM cells 220, a register 80 containing mask information, and a decoder 82. In typical IP use, CAM cells 220 store an IP address for the entry, and register 80 stores an IP prefix for the address. Entry hit line 72 is connected to MOS transistors 540. The CAM entry in this figure illustrates a first design of a masking circuit comprising a mask index register 80 and a index decoder 82. The output of decoder 82 becomes masking control line 78. Masking control line 78 is connected to the corresponding CAM cell AND gate 56. The content of register 80 is output via mask value lines 86.

Figure 2:
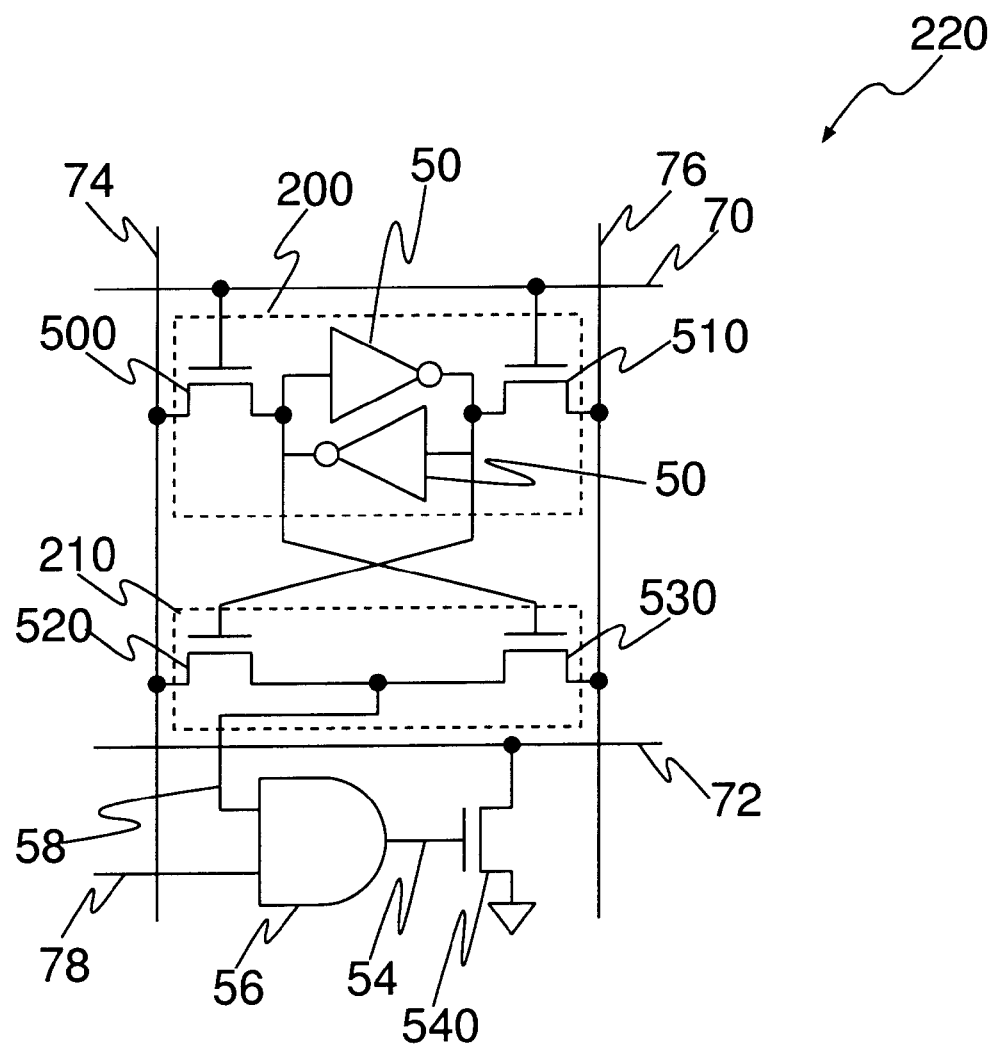
FIG. 2 shows the structure of a CAM cell according to the invention.

FIG. 2 shows the detail structure of a CAM cell. It comprises a memory cell 200, a comparator 210, and an AND gate 56. The memory cell 200 comprises two inverters 50, and two MOS transistors 500 and 510. Both gates of MOS transistor 500 and 510 are connected to word line 70. One channel of the MOS transistor 500 is connected to positive bit line 74. Another channel of the MOS transistor 500 is connected to one side of the inverters. One channel of the MOS transistor 510 is connected to negative bit line 76. Another channel of the MOS transistor 510 is connected to another side of the inverters.

A comparator 210 comprises two MOS transistors 520 and 530. Line 58, which is the output of comparator 210, and line 78, which is the masking control line, are connected to AND gate 56. An output of AND gate 56 becomes bit match 54. Bit match 54 is connected to MOS transistor 540, which controls entry hit line 72.

Figure 3:
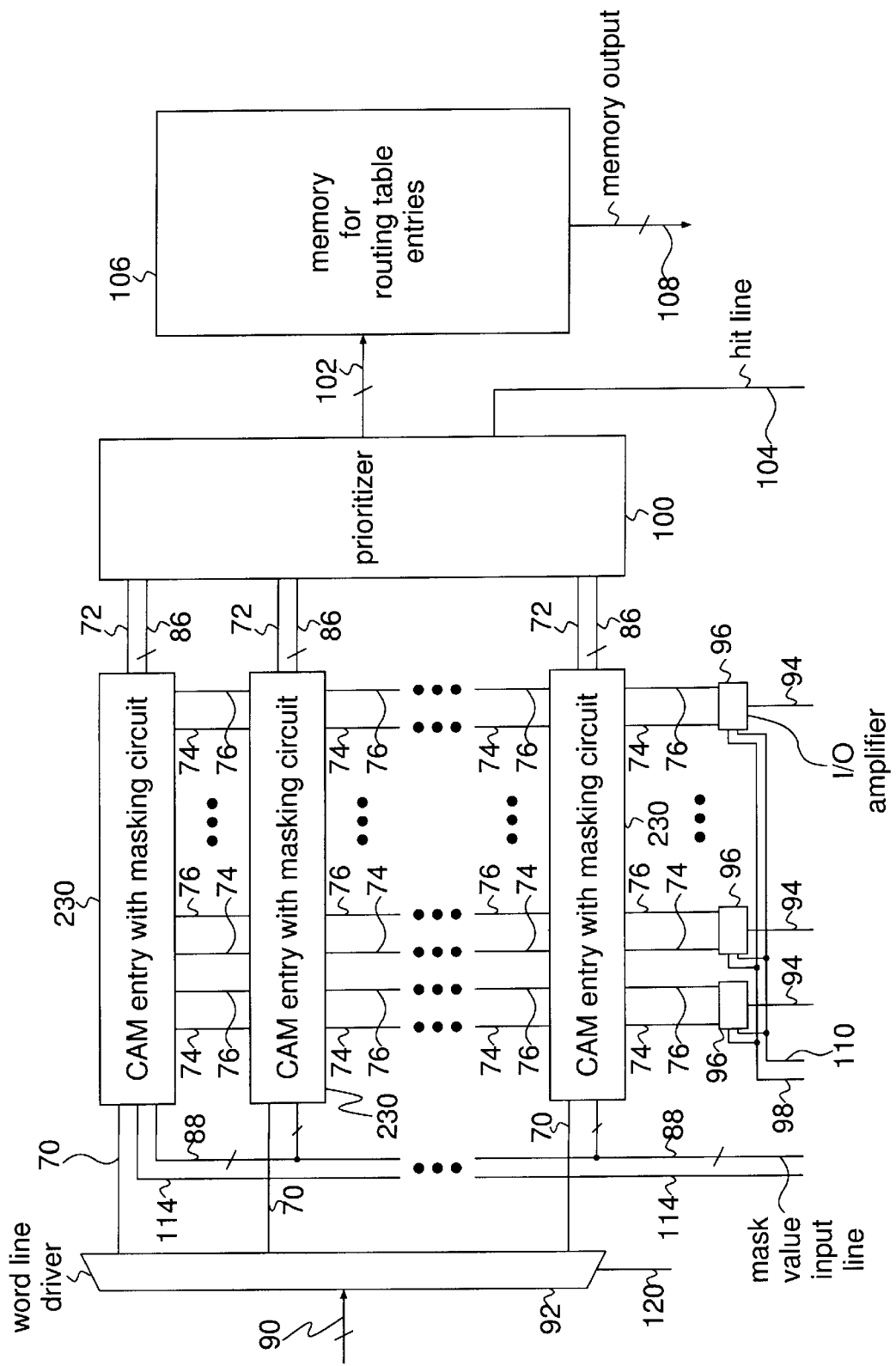
FIG. 3 shows the whole structure of the first CAM of FIG. 1 comprising CAM entries.

FIG. 3 shows a preferred embodiment of a CAM comprising a plurality of CAM entries 230. Entry address bus 90 is connected to word line driver 92. Each word line 70 is also connected to word line driver 92. Search key input/output lines 94 are connected to input/output amplifier 96. Read/write control line 110 and data enable line 98 are connected to all of input/output amplifiers 96. Mask value input line 88 and read/write control line 114 are connected to all CAM entries 230. Each entry hit line 72 and each mask value line 86 is connected to prioritizer 100, which outputs a hit entry address onto hit entry address bus 102. Prioritizer 100 also outputs route hit information via hit line 104. Hit entry address 102 is connected to a memory 106 containing the associated value of the CAM entry (i.e. additional routing table entry information used in routing). The associated value is output via memory output 108.

Figure 4:
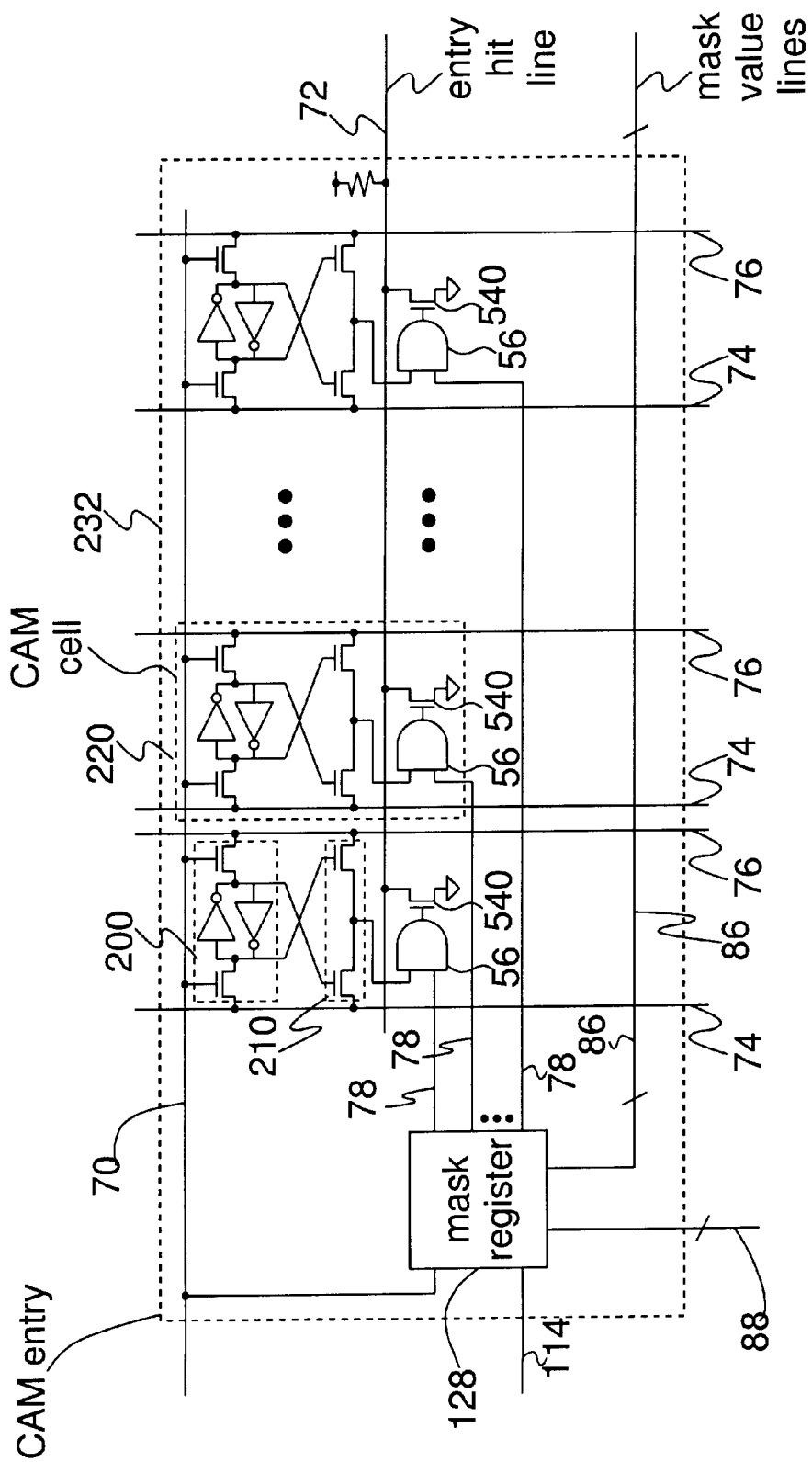
FIG. 4 shows the structure of an entry of the first CAM having a mask register for a masking circuit.

FIG. 4 shows a CAM entry having a second masking circuit design which has no decoder. Mask input line 88 is connected to mask register 128. The output of mask register 128 is directly connected to each CAM cell AND gate 56.

Figure 5:
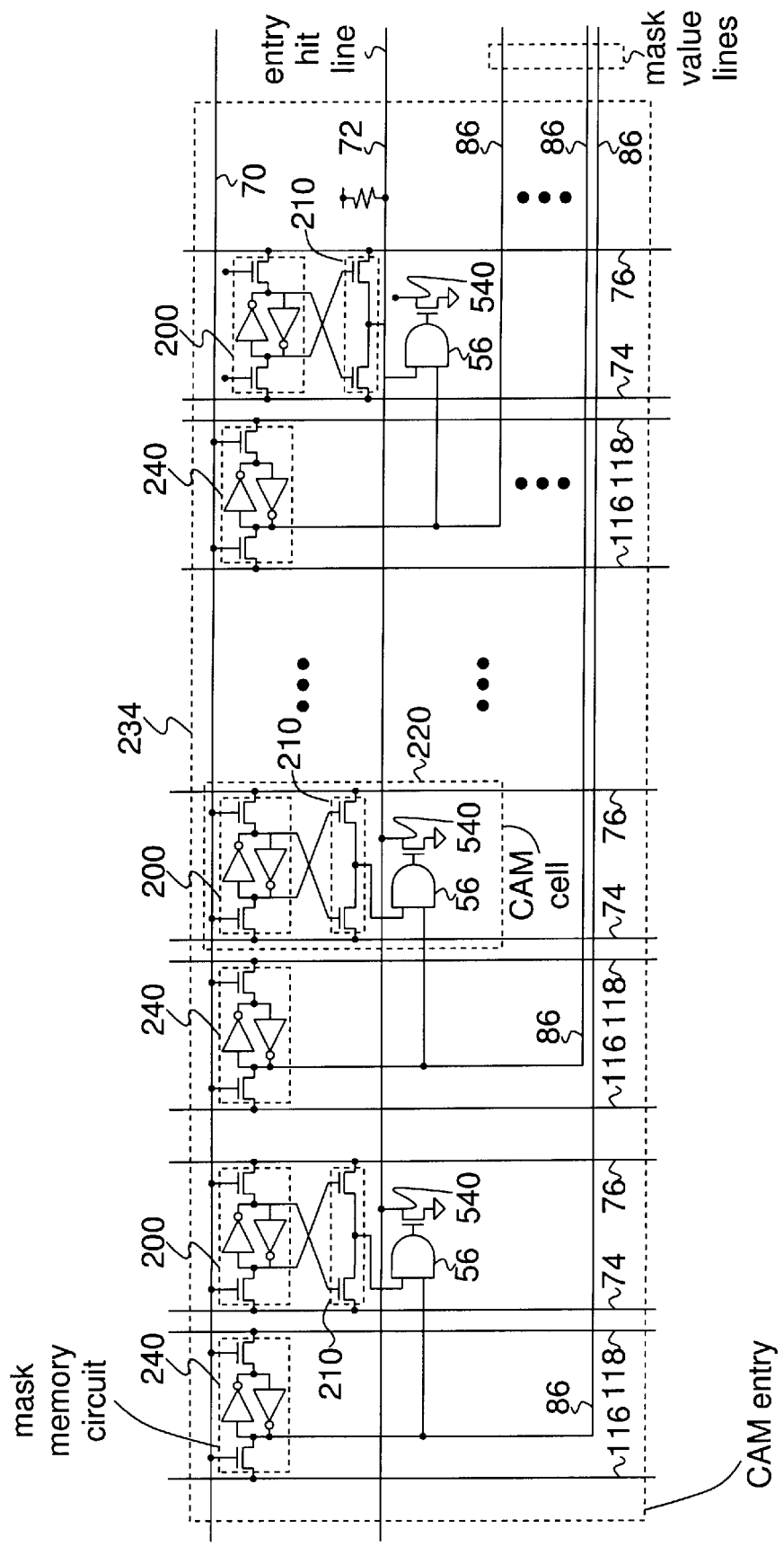
FIG. 5 shows the structure of an entry of the first CAM having a memory cell for each CAM cell as a masking circuit.

FIG. 5 shows another CAM entry having a third mask circuit design, similar to that of FIG. 4. In this design, each CAM cell has an associated memory cell 240 for storing masking information. The output of memory cell 240 is connected directly to the corresponding CAM cell's AND gate 56. The output of memory cell 240 also becomes mask value line 86.

Figure 6:
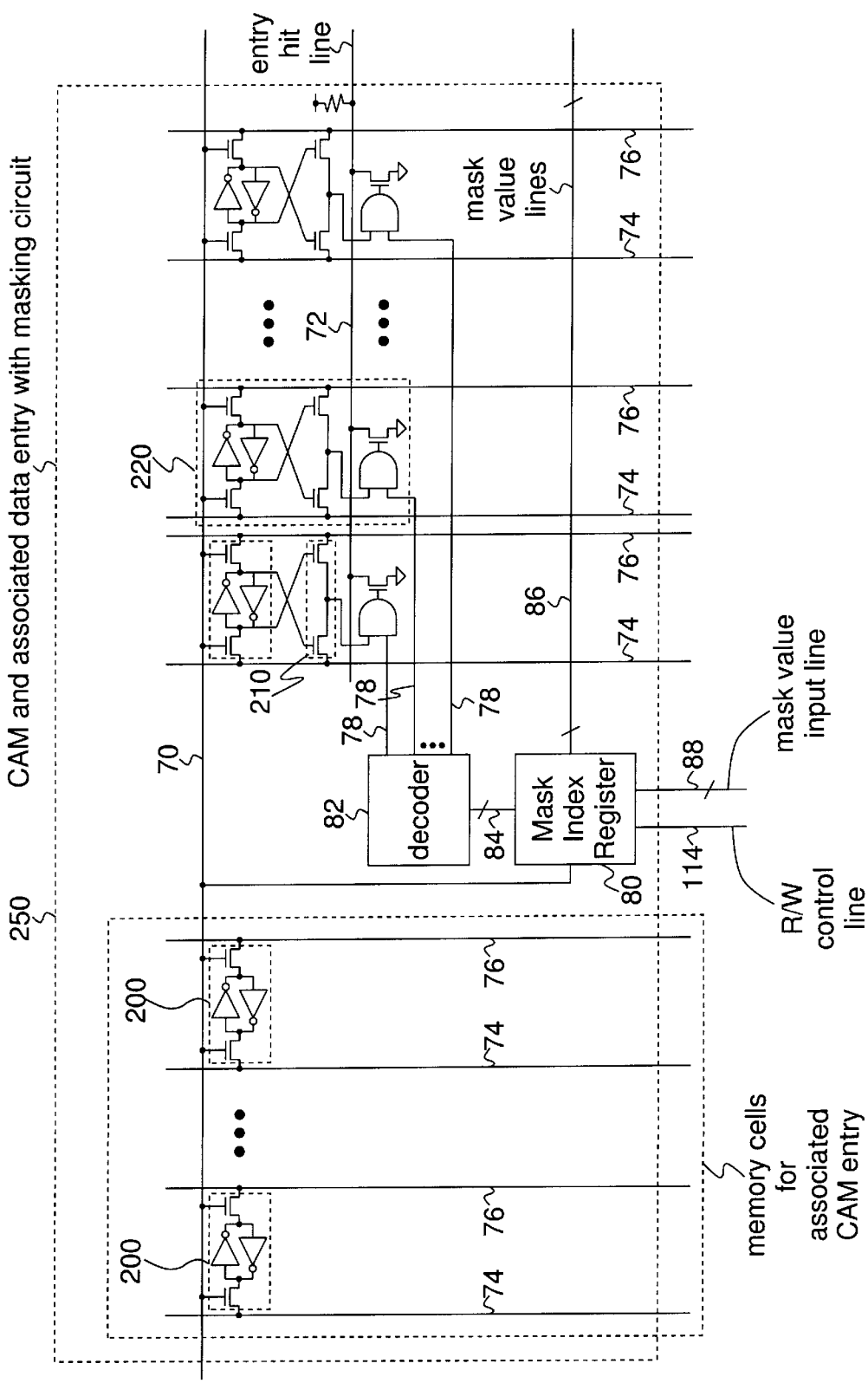
FIG. 6 shows the structure of an entry of a second CAM according to the invention.

FIG. 6 shows a CAM entry having its associated value in the same entry, rather than stored in a separate memory 106 (FIG. 3). The associated value is stored in memory cells 200. Word line 70 is connected to both CAM cells 220 and memory cells 200.

Figure 7:
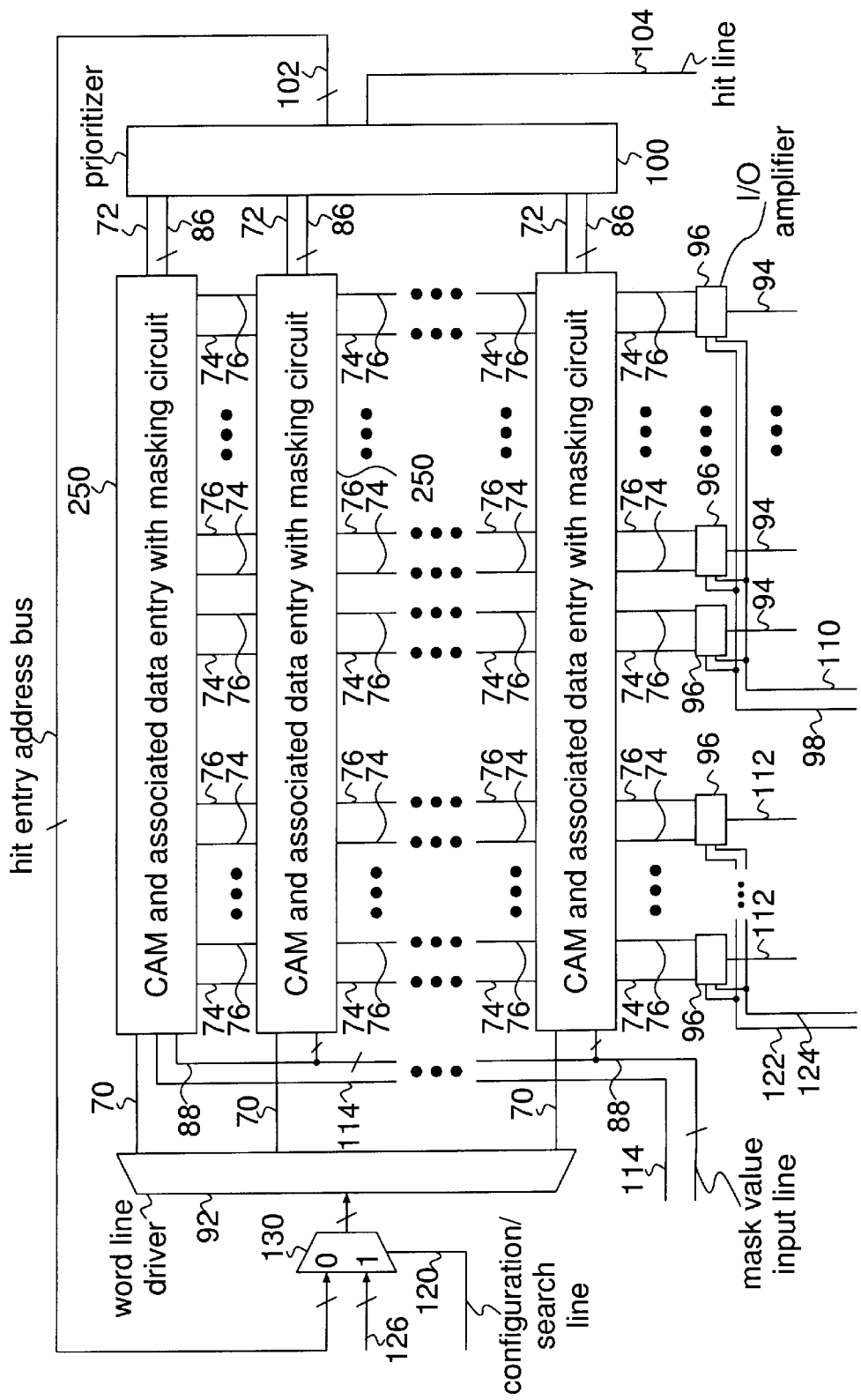
FIG. 7 shows the whole structure of the second CAM comprising the CAM entries of FIG. 6.

FIG. 7 shows a second CAM design comprising a plurality of CAM entries 250. Both hit entry address bus 102 and entry address bus for configuration 126 are connected to multiplexer 130. Multiplexer 130 selects either hit entry address bus 102 or entry address bus 126 and connects it to word line driver 92 based on configuration/search control line 120. Each word line 70 is also connected to word line driver 92. Search key input/output lines 94 are connected to input/output amplifier 96. Read/write control line 110 and data enable line 98 are connected to all of input/output amplifiers 96 for CAM cells. Mask value input line 88 and read/write control line 114 are connected to all of CAM entries 250. Read/write control line 124 and data enable line 122 are connected to all amplifiers 96. Each entry hit line 72 and each mask value line 86 is connected to prioritizer 100 which outputs a selected hit entry address onto hit entry address bus 102. It also outputs route hit information via hit line 104. Hit entry address 102 is connected to a memory 106 containing the associated value of the CAM entry (i.e. routing table entry information used in routing). The associated value is output via input/output line 112.

Figure 14:
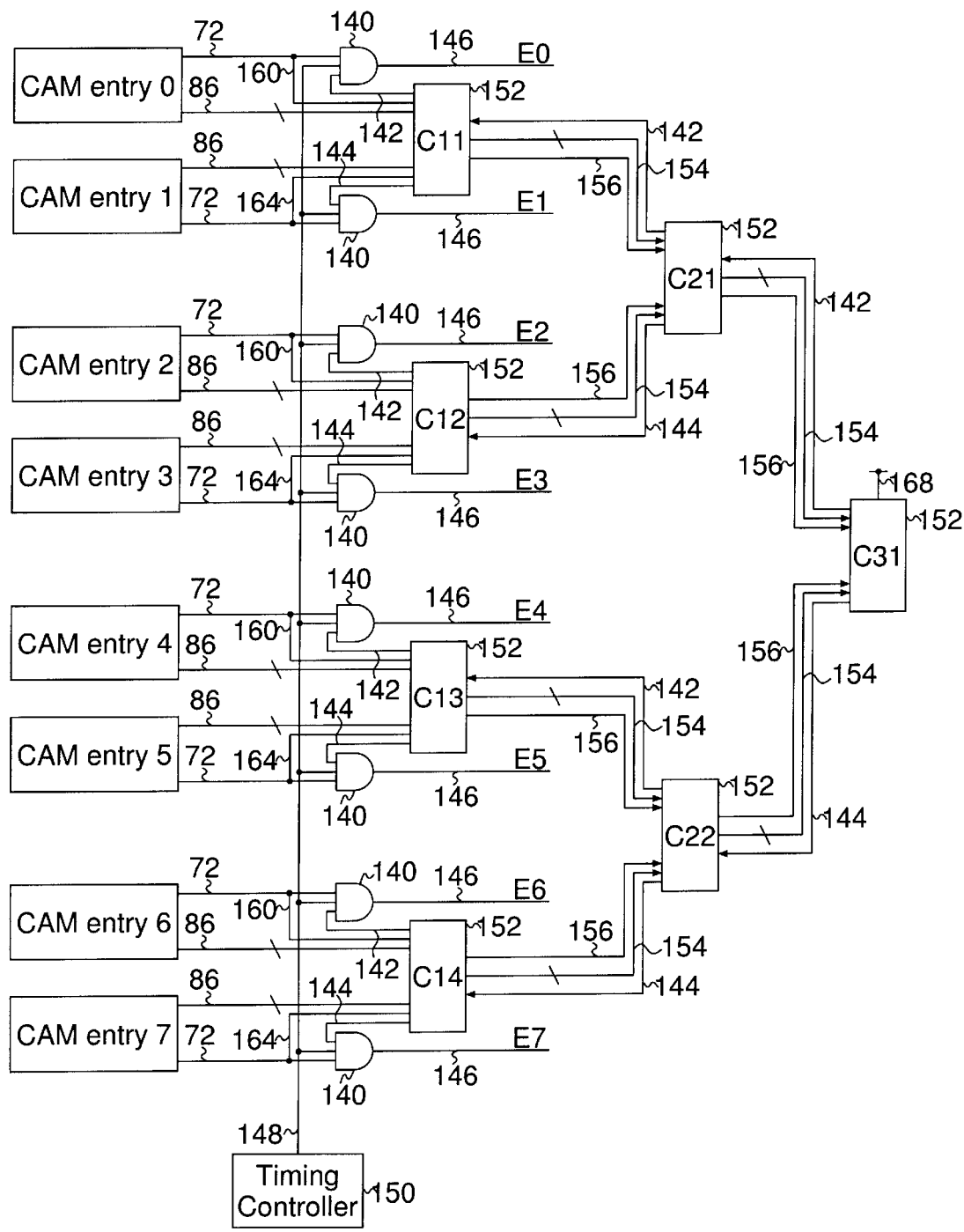
FIG. 14 shows an example of a prioritizer according to the present invention.
Figure 16:
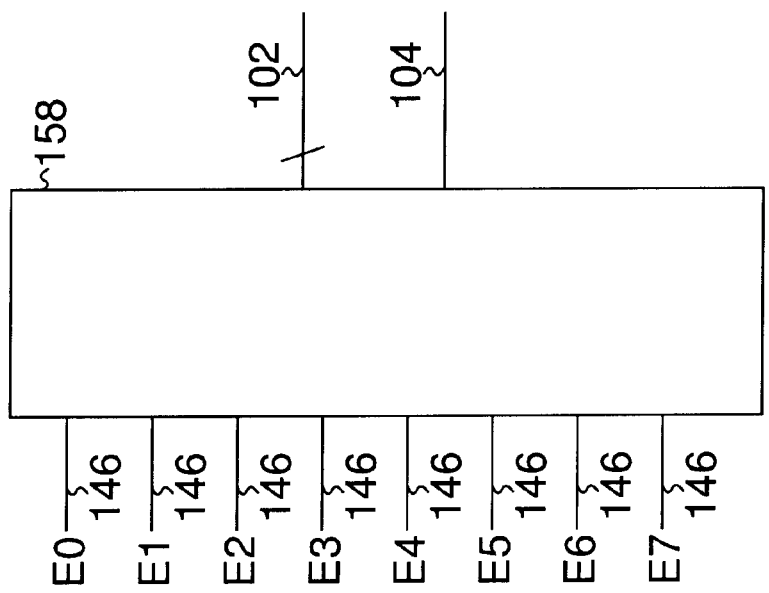
FIG. 16 shows an encoder according to the invention.

FIG. 14 shows a simple prioritizer designed in accordance with the present invention. Entry hit lines 72 of CAM entries 0, 2, 4, and 6 are connected to corresponding AND gates 140 and lines 160 of corresponding comparators 152 (see also FIG. 15). Entry hit lines 72 of CAM entries 1, 3, 5, and 7 are connected to both corresponding AND gates 140 and lines 164 of corresponding comparators 152. Mask value lines 86 of CAM entries 0, 2, 4, and 6 are connected to lines 162 of corresponding comparators 152. Mask value lines 86 of CAM entries 1, 3, 5, and 7 are connected to lines 166 of corresponding comparator 152. Line 142 of C21 is connected to input line 168 of C11. Line 144 of C21 is connected to input line 168 of C12. Line 142 of C22 is connected to input line 168 of C13. Line 144 of C22 is connected to input line 168 of C14 Line 142 of C31 is connected to input line 168 of C21. Line 144 of C31 is connected to input line 168 of C22.

Although the following operational description is provided in terms of IP routing, those skilled in the art will appreciate that the present invention is obviously applicable for routing in other network protocols. In this description, a high voltage level is described as '1' and a low voltage level is described as '0'.

The CAM routing table entry of FIG. 1 contains a destination IP address and a destination IP prefix. In particular, CAM cells 220 contain a destination IP address, and register 80 contains a corresponding destination IP prefix. In this embodiment, additional associated entry values for the routing table entry are stored in different memory 106 (FIG. 3). There are 32 CAM cells 220 in FIG. 1 which are arranged to store, from left to right, bits 31 through 0 of the destination IP address.

FIG. 2 shows the detailed structure of a CAM cell 220. It comprises a memory cell 200, a comparator 210, an AND gate 56, and a MOS transistor 540. One bit datum is written into or read from each memory cell via positive bit line 74 and negative bit line 76 by setting word line 70 to 1. Comparator 210, which is connected to memory cell 200, positive bit line 74, and negative bit line 76, compares the content of memory cell 200 with the search key provided via positive bit line 74 and negative bit line 76. The result of comparison is provided to one input of AND gate 56 via line 58. The result of the comparison is 0 whenever the search key matches the content of memory cell 200, and is 1 whenever the search key does not match the content of memory cell 200. Hence entry hit line 72 becomes 0, which means "does not match", only when the following two conditions are both true:

1. the search key does not match the content of memory cell 200
2. mask input 78 is set to 1

An IP address for a search key is input to positive bit lines 74 and negative bit lines 76 via input/output amplifier 96. Each result bit of comparison is provided to an input of AND gate 56 as described above. Another input of AND gate 56 is connected to decoder 82. Decoder 82 decodes an IP prefix input from register 80 into bit mask values as shown in Table 1 below.

TABLE 1

| IP prefix value | decoder output | | | | | |
|---|---|---|---|---|---|---|
| | 31 | 30 | ... | 2 | 1 | 0 |
| 32 | 1 | 1 | ... | 1 | 1 | 1 |
| 31 | 1 | 1 | ... | 1 | 1 | 0 |
| 30 | 1 | 1 | ... | 1 | 0 | 0 |
| 29 | 1 | 1 | ... | 0 | 0 | 0 |
| . | . | . | . | . | . | . |
| . | . | . | . | . | . | . |
| . | . | . | . | . | . | . |
| 1 | 1 | 0 | ... | 0 | 0 | 0 |
| 0 | 0 | 0 | ... | 0 | 0 | 0 |

If the IP prefix value in register 80 is 24, the leading 24 inputs to AND gate 56 are set to 1, and the rest of inputs to AND gate 56 are set to 0. Hence only the result of the comparison for the leading 24 bits of two IP addresses (a search key and the IP address in memory cells) affects the value of entry hit line 72. The result of the comparison for the rest of the bits of the IP addresses is masked out because the output of AND gate 56 is set to 0 and MOS transistors 540 corresponding to these bits do not set entry line 72 to 0 since one input of the AND gates 56 is set to 0 by register 80 and decoder 82. Accordingly, each entry compares only the network portion of both the search key and the destination IP address in CAM cells 220 in parallel. This is an essential feature of the invention.

If the value of an IP prefix is 32, that entry becomes a host route entry. If the value of an IP prefix is 0, that entry becomes the default route entry. Accordingly, this routing table can contain all kinds of routes, and need not divide the memory into banks. This is an important and advantageous feature of the invention.

FIG. 4 shows another implementation of a masking circuit. In this embodiment, mask register 128 contains a full 32 bit mask value, rather than an IP prefix value that requires decoding.

FIG. 5 shows another implementation of the masking circuit. Each CAM cell 200 has an associated mask memory cell 240 for storing a bit of the mask value for masking the result of comparison in each CAM cell. Mask value lines 86 are provided to both prioritizer 100 and to the AND gates 56 of the corresponding CAM cells. The result of comparison in each CAM cell is masked out when the value of corresponding mask memory cell is 0.

The masking circuits in FIGS. 1, 4, anf 5 are examples of various ways of implementation. Those skilled in the art will appreciate that many other equivalent masking circuits can be designed to perform the same masking as these circuits.

FIG. 3 shows the entire routing table. Word line driver 92 outputs 1 to the word line of the entry specified with entry address bus 90 when configuration/search line 120 is set to "configuration". When an IP address and a corresponding IP prefix are written into a CAM entry specified whith the entry address, the operation is as follows:

1. set configuration/search line 120 to "configuration"
2. set read/write control line for CAM cell 110 to "write"
3. set read/write control line for mask circuit 114 to "write"
4. set data enable line for CAM cells 98 to 1
5. put input data for a CAM entry onto search key input/output line 94
6. put a mask value onto mask value input line 88

Word line driver 92 outputs 0 onto all of word lines 70 when configuration/search line 120 is set to "search". Accordingly, configuration/search line 120 is set to "search" when searching for a route. An IP address for a search key is provided via search key input line 94. The comparison between the search key and the content of the CAM cells in each entry described above is performed in parallel. Consequently, the search is very fast and is performed in deterministic time.

Each entry hit line is connected to prioritizer 100 which encodes the inputs in FIG. 3 as follows:

1. if all the hit entry lines 72 are 0, the prioritizer outputs 0 on route hit line 104, which means "miss" (no entry matched).
2. if there is only one hit entry line 72 activated, the prioritizer outputs 1 on route hit line 104 and outputs the hit entry address on hit entry address line 102
3. if there are multiple hit entry lines 72 activated, the prioritizer outputs 1 on route hit line 104 and outputs the address of the hit entry that has the largest IP prefix value among the entries whose entry hit lines 72 are 1.

For example, in the case there are two entries in the routing table as follows:

entry address 10, IP address 128.32.0.0, IP prefix 16
entry address 20, IP address 128.32.33.0, IP prefix 24 and the search key is 128.32.33.10, the entry hit lines 72 for both entries become 1. Then prioritizer 100 chooses entry 20 because its IP prefix value is larger than that of entry address 10. Note that an IP prefix value was provided by the CAM and used by the prioritizer to select the best of several matching entries. This is an important and advantageous feature of the present invention.

FIG. 14 shows an example implementation of prioritizer 100. The simple prioritizer shown processes only 8 CAM entries for purposes of clarity. Nevertheless, from the present description it will be obvious to those skilled in the art how to implement a similar prioritizer to process arbitrarily large CAM entries.

Comparator 152 takes the following inputs:

input data A valid signal input data A input data B valid signal input data B

Figure 15:
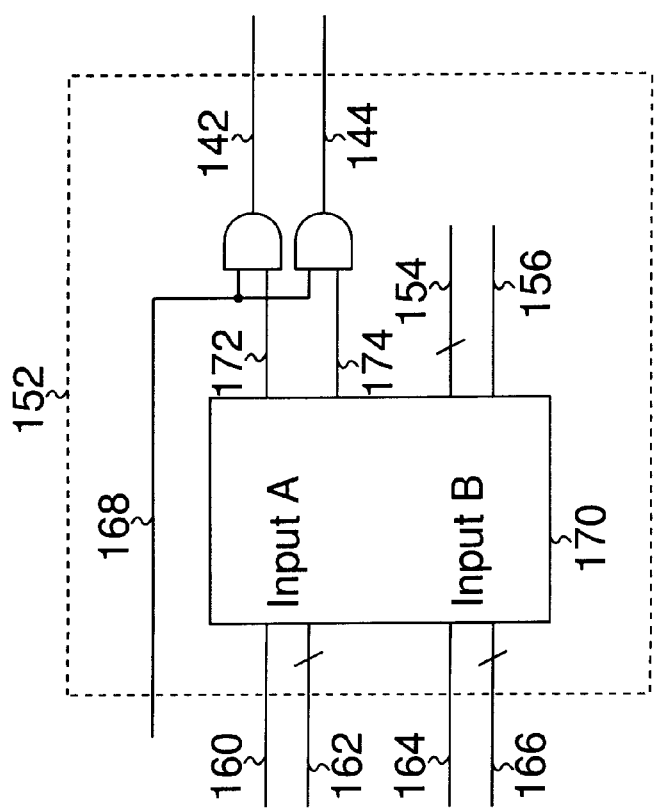
FIG. 15 shows the structure of a comparator according to the invention.

FIG. 15 shows the structure of comparator 152. Comparator 152 comprises a comparison circuit 170 and two AND gates. Comparison circuit 170:

- outputs 1 onto line 172 when it chooses input A
- outputs 1 onto line 174 when it chooses input B
- outputs the chosen input onto line 154
- outputs 1 onto line 156 when it chooses one out of two inputs
- outputs 0 onto line 156 when it chooses none of two inputs Comparison circuit 170 chooses one input out of two inputs, which are input A and input B, as follows:

1. it chooses nothing if none of two inputs is valid
2. it chooses the valid input if the only one of two inputs is valid
3. it chooses the numerically larger input if both inputs are valid Accordingly, the truth table of comparison circuit 170 is as follows:

| input | | | output | | | |
|---|---|---|---|---|---|---|
| 160 | 164 | input data | 172 | 174 | 154 | 156 |
| 0 | 0 | — | 0 | 0 | — | 0 |
| 0 | 1 | — | 0 | 1 | B | 1 |
| 1 | 0 | — | 1 | 0 | A | 1 |
| 1 | 1 | A > B | 1 | 0 | A | 1 |
| 1 | 1 | B > A | 0 | 1 | B | 1 |

The values of lines 142 and 144 are controlled by output enable line 168. The values of lines 142 and 144 are always 0 when output enable 168 is 0.

In FIG. 14, mask value lines 86 of CAM entry 0 and CAM entry 1 are connected to comparator C11. The mask value lines of CAM entry 2 and CAM entry 3 are connected to comparator C12, those of CAM entry 4 and CAM entry 5 are connected to comparator C13, and those of CAM entry 6 and CAM entry 7 are connected to comparator C14. C11 and C12 output the result of their comparison, which is the input data of the larger input and data valid signal, to C21 via line 154 and line 156. C13 and C14 output the result of their comparison to C22 via its line 154 and line 156. C21 outputs the result of comparison between C11's output and C12's output to C31 via its lines 154 and 156. C22 outputs the result of its comparison between C13's output and C14's output to C31 via its lines 154 and 156. C31 enables none of line 142 and line 144, or enables either one of line 142 or 144, based on the result of comparison between C21's output and C22's output. The only one (or none) of the inputs to AND gate 140 connected to line 142 or line 144 of comparators C11 to C14 is set to 1 based on the result of comparison against 8 inputs. Accordingly, only one (or none) of AND gates 140, which indicates the CAM entry having the largest mask value, outputs 1 to encoder 158. The truth table of encoder 158 is as follows:

| input | | | | | | | | output | |
|---|---|---|---|---|---|---|---|---|---|
| E0 | E1 | E2 | E3 | E4 | E5 | E6 | E7 | 102 | 104 |
| 0 | 0 | 0 | 0 | 0 | 0 | 0 | 0 | 0 | 0 |
| 1 | 0 | 0 | 0 | 0 | 0 | 0 | 0 | 0 | 1 |
| 0 | 1 | 0 | 0 | 0 | 0 | 0 | 0 | 1 | 1 |
| 0 | 0 | 1 | 0 | 0 | 0 | 0 | 0 | 2 | 1 |
| 0 | 0 | 0 | 1 | 0 | 0 | 0 | 0 | 3 | 1 |
| 0 | 0 | 0 | 0 | 1 | 0 | 0 | 0 | 4 | 1 |
| 0 | 0 | 0 | 0 | 0 | 1 | 0 | 0 | 5 | 1 |
| 0 | 0 | 0 | 0 | 0 | 0 | 1 | 0 | 6 | 1 |
| 0 | 0 | 0 | 0 | 0 | 0 | 0 | 1 | 7 | 1 |

Timing Controller 150 controls the delay of the operation of comparison. It outputs 1 to output enable line 148 when the entire comparison operation finishes.

For example, assume CAM entry 2 and CAM entry 4 output a "hit" signal. Also assume CAM entry 2 has mask value 15 and CAM entry 4 has mask value 20. In this case, C11 and C14 output 0 onto line 156 because both input data valid signal 160 and 164 are 0. C12 outputs CAM entry 2's mask value onto line 154 and outputs 1 (data valid) onto line 156 because C12's line 160 is set to 0. C21 also outputs CAM entry 2's mask value onto its line 154 and outputs 1 onto its line 156 because its input line 160 is set to 0 by C11. C13 outputs CAM entry 4's mask value onto line 154 and outputs 1 (data valid) onto line 156 because C13's line 164 is set to 0. C22 also outputs CAM entry 4's mask value onto line 154 and outputs 1 onto line 156 because its input line 164 is set to 0 by C14. C31 compares the input value from C21, which is from CAM entry 2, and the input value from C22, which is from CAM entry 4. C31 outputs 1 onto line 144 because CAM entry 4's mask value 20 is larger than CAM entry 2's mask value 15. C21's line 142 and line 144 are set to 0 because C21's output enable 168 is set to 0 by C31. Hence all the value of E0 to E3 becomes 0 because C11 and C12 output 0 onto line 142 and line 144. C22 outputs 1 onto line 142 because its line 168 is set to 1 by C31. C13 outputs 1 onto its line 142 because its line 172 is 1 and its line 168 is set to 1 by C22. Hence the value of E4 becomes 1. The value of E5 becomes 0 because C13 outputs 0 onto its line 144 via line 174. C14 outputs 0 onto its line 142 and line 144 because its line 168 is set to 0 by C22. Hence the value of E6 and E7 become 0. Accordingly, only E4 becomes 1 and the encoder outputs the value 4, which is CAM entry 4's entry address, and outputs 1, which means "hit" to line 104.

The prioritizer described above in relation to FIG. 14 is one possible example of implementation. Those skilled in the art will appreciate that many other implementations can be used to perform a similar function in an equivalent way.

FIG. 6 shows the structure of an alternative embodiment of a CAM entry for a routing table. In this embodiment, each entry has memory cells for storing associated entry values. This design eliminates the need for (or reduces the size of) memory 106, but increases the size of the CAM. Those skilled in the art will appreciate that memory design choices such as these will depend on trade-offs determined by the specific application and industrial need of the device.

FIG. 7 shows the structure of an additional CAM design. Multiplexer 130 is controlled by configuration/search line 120. Multiplexer 130 selects hit entry address bus 102 as the input address to word line driver 92 when configuration/search line 120 is set to 0, which means "search". Multiplexer 130 selects entry address bus 126 when configuration/search line 120 is set to 1, which means "configuration". Configuration/search line 120 is set to 1 when data are written to CAM cells and memory cells. The operation of configuration is as follows:

1. set configuration/search line 120 to 1
2. put an entry address onto entry address bus 126
3. plat data for CAM cells onto search key input line 94
4. set read/write control line for CAM cells 110 to "write"
5. set data enable line for CAM cells 98 to 1
6. put data for memory cells onto the input/output line for memory cells 112
7. set read/write control line for memory cells 124 to "write"
8. set data enable line for memory cells 122 to 1

Configuration/search line 120 is set to 0 in the search operation. The hit entry address is output onto hit entry address bus 102. The hit entry address is provided into word line driver 92 by multiplexer 130 since configuration/search line 120 is set to 0. Word line driver 92 sets the corresponding entry's word line 70 to 1. Accordingly, the associated value in the memory cells can be read by setting read/write control line 124 to "read".

Figure 8:
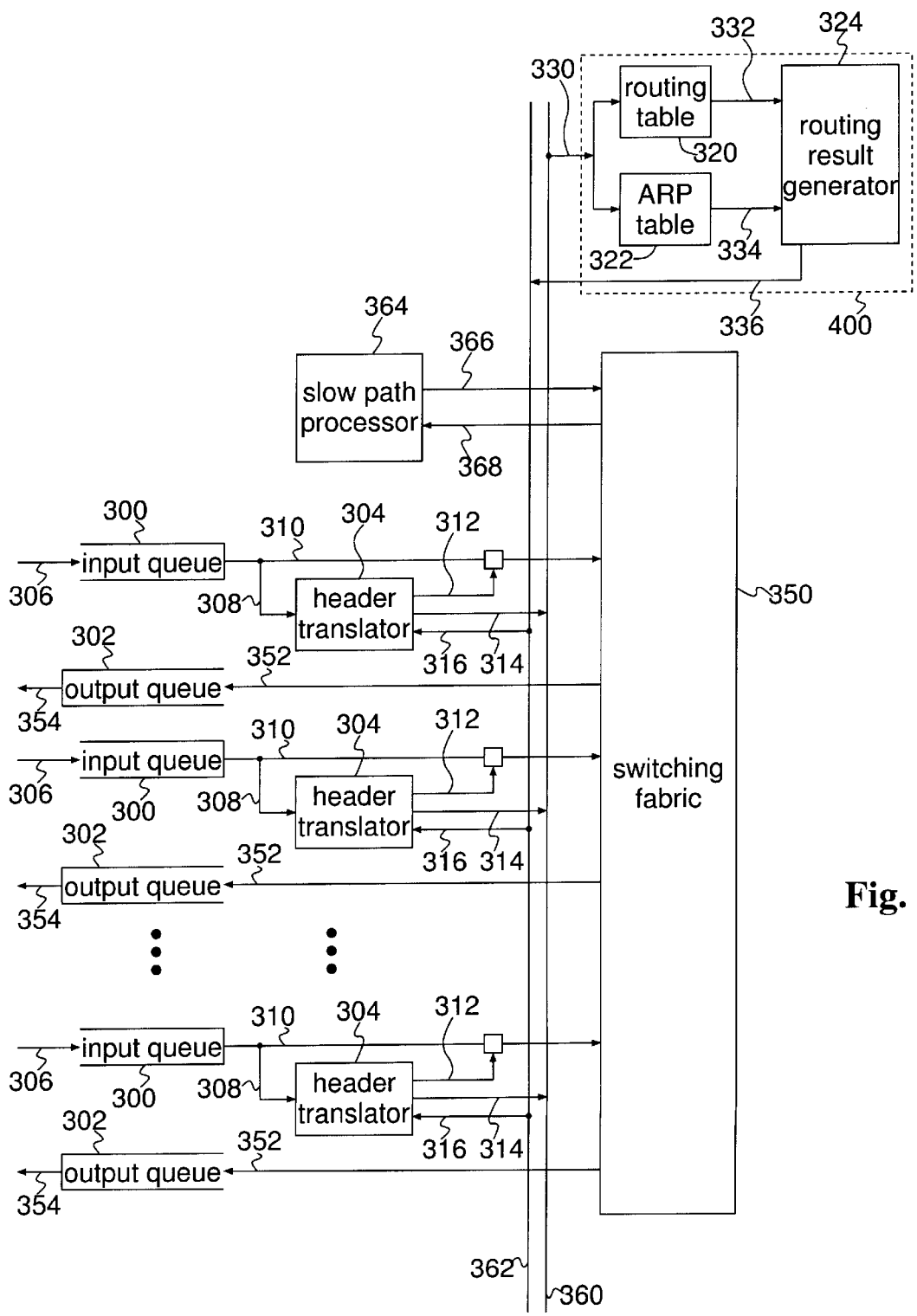
FIG. 8 shows an example of a router using the first CAM or the second CAM for the routing table.
Figure 10:
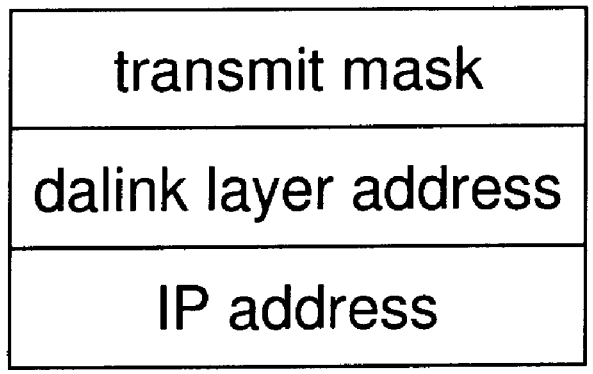
FIG. 10 shows the data structure which the routing engine returns to the header translator of FIG. 9.

FIG. 8 shows an example router encompassing the present invention. Incoming frames from line 306 are provided into input queue 300. A datalink layer header and an IP header are sent to header translator 304 via line 308. The destination IP address of an incoming frame is sent to routing engine 400 via routing information bus 360. A destination IP address is sent to both routing table 320 and ARP table 322. Routing table 320 outputs the next router's IP address, datalink layer address, and the transmit mask onto line 332. The transmit mask contains a bit mask of the output port or ports. Routing table 320 sets the next router's IP address to 0 and sets datalink layer address to the result of the ARP table lookup if the route is a direct route. ARP table 322 looks up the datalink layer address of the incoming IP address and outputs the result onto line 334. It sets the result to 0 if the look-up fails. Routing result generator 324 outputs the data described in FIG. 10. Routing result generator 324:

1. sets "IP address" in FIG. 10 to the next router's IP address if the route is an indirect route
2. sets "IP address" in FIG. 10 to 0 if the route is a direct route
3. sets "datalink layer address" in FIG. 10 to the next router's datalink layer address if the route is a indirect route
4. sets "datalink layer address" in FIG. 10 to the result of ARP table lookup if the route is a direct route
5. sets all the parts in FIG. 10 to 0 if there is no routes.

Figure 13:
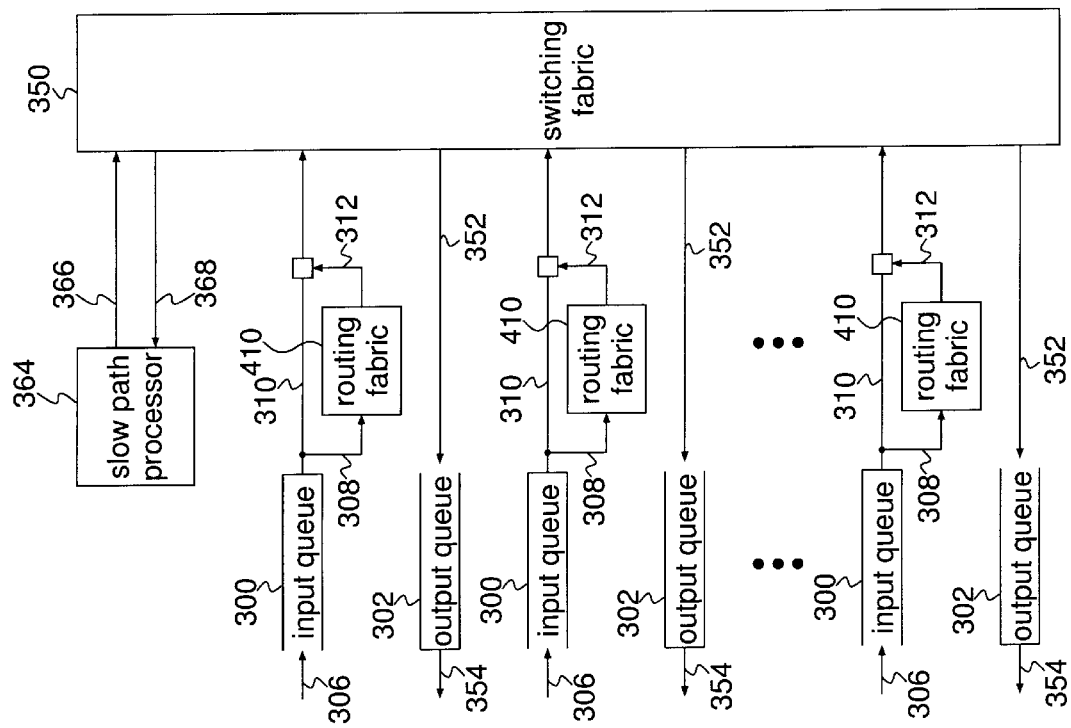
FIG. 13 shows another example of a router using either the first CAM or the second CAM.
Figure 12:
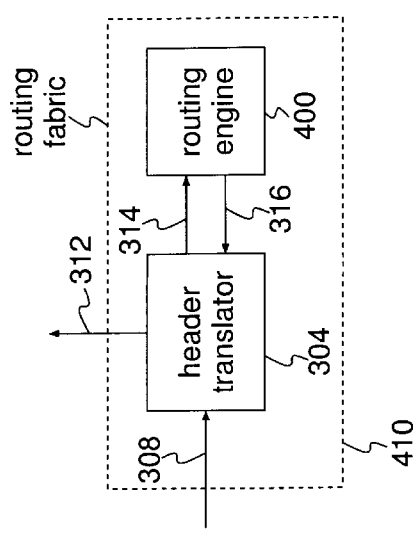
FIG. 12 shows another routing engine according to the invention.

The routing result is sent back to header translator 304 via bus 362 and line 316. Routing engine 400 is shared with a plurality of ports in this example. But, as shown FIG. 12, each port can have a routing engine 400, providing very fast performance. FIG. 13 shows another example of a router having a routing engine 400 for each port.

Figure 9:
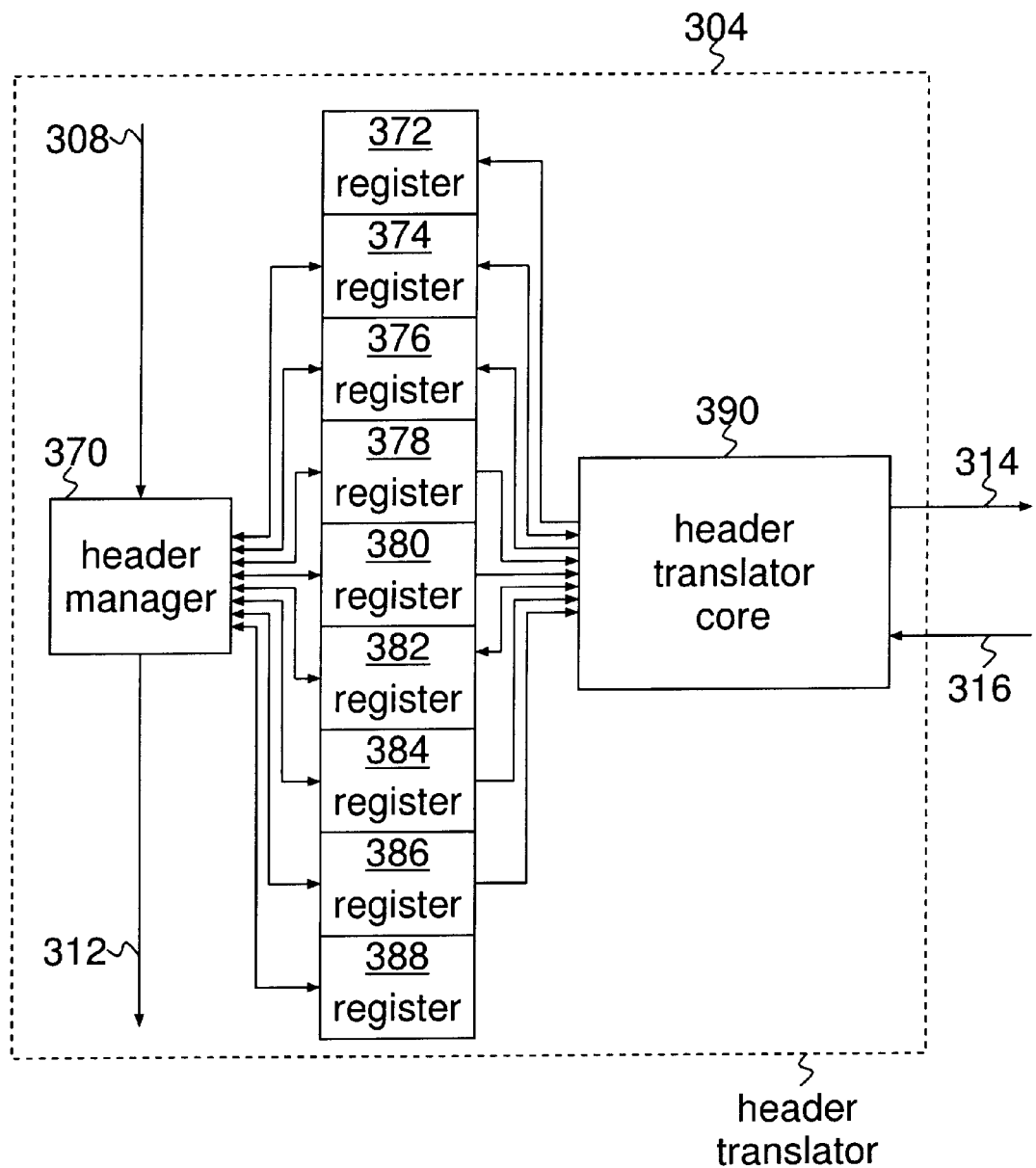
FIG. 9 shows the detailed structure of a header translator used in the router of FIG. 8.
Figure 11:
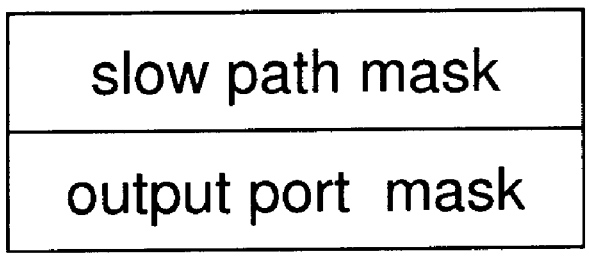
FIG. 11 shows the data structure which the header translator outputs to the switching fabric of FIG. 8.

FIG. 9 shows the details of header translator 304. A datalink header and IP header are provided to header manager 370 via line 308. Header manager 370 stores each part of the header to registers 372 to 388. Header translator 390 creates the transmit mask by using the information from routing engine 400. It also stores the created transmit mask value into register 372. FIG. 11 shows the structure of the transmit mask. The transmit mask comprises a slow path mask and an output port mask. Switching fabric 350 sends frames to slow path processor 364 if the value of the slow path mask is not 0 regardless of the value of the port mask. The slow path mask can be just one bit or several bits. In the case where the slow path mask has just one bit, there is only one slow path. In the case where the slow path mask has several bits, there are multiple prioritized slow paths. The header is processed as follows:

Header translator core 390:

sets the slow path mask if the protocol type in register 378 is ARP sets the slow path mask if the datalink layer destination address in register 374 is the broadcast address and the protocol type in register 378 is IP sets the slow path mask if either the version is not 4 or the header length is not 5 in register 380 sets the slow path mask if the protocol type in register 378 is not either ARP or IP sets the slow path mask if the TTL value in register 382 is 1 or 0 decrements TTL, re-calculates the header checksum in register 382, and writes them back to register 382 if the TTL value in register 382 is neither 1 nor 0 sends the destination IP address in register 386 to routing engine 400 and gets the result described above sets the slow path mask if the destination datalink layer address in the result is 0 writes the destination datalink layer address into register 374 and the value of transmit mask of the result into register 372 sets register 376 to its own datalink layer address.

sends the new header from line 312 to switch fabric 350.

The rest of frame, which is the payload of the frame, is also sent to switch fabric 350 immediately following the header.

CONCLUSION

Accordingly, the present invention provides:

a new cam whose entries can be individually masked a new cam which outputs mask information together with a correspondingt hit entry address a routing table comprising a prioritizer which selects one of several hit entries based on corresponding mask values for the entries.

a routing table enabling very fast and deterministic look-up time

What is claimed is:

1. A routing table circuit for determining from a destination address an associated table entry, the circuit comprising:

a plurality of routing table entries for determining in parallel a set of routing table entry hit addresses from the destination address, a prioritizer for selecting a single routing entry address from the set of routing table entry hit addresses, and a memory for producing the associated table entry from the single routing entry address, wherein each entry in the routing table comprises:

a collection of CAM cells for storing stored address bits;

a masking circuit for masking a portion of the stored address bits in accordance with an address prefix associated with the stored address bits; and a mask output circuit for providing the address prefix to the prioritizer.

2. A method for routing a data packet having a packet destination address, the method comprising:

determining from the packet destination address an associated table entry; and routing the packet in accordance with the associated table entry;

wherein the step of determining the associated table entry from the packet destination address comprises:

determining a set of table entry hit addresses by applying the packet destination address to a collection of CAM cells that store a stored address and store an address prefix of the stored address;

selecting a single entry address from the set of table entry hit addresses, and producing the associated table entry from the single entry address.

3. An apparatus for routing a data packet having a packet destination address, the apparatus comprising:

a routing table circuit for determining from the packet destination address a next device identifier; and a switching fabric for routing the packet in accordance with the next device identifier;

wherein the routing table circuit comprises:

a plurality of routing table entries for determining in parallel a set of table entry hit addresses from the destination address, a prioritizer for selecting a single entry address from the set of table entry hit addresses, and a memory for producing the next device identifier from the single entry address, wherein each entry in the routing table comprises:

a collection of CAM cells for storing stored address bits; and a masking circuit for masking a portion of the stored address bits in accordance with an address prefix for the destination address.

* * * * *

UNITED STATES PATENT AND TRADEMARK OFFICE
CERTIFICATE OF CORRECTION

| | |
|---|---|
| PATENT NO. | : 6,181,698 B1 |
| DATED | : January 30, 2001 |
| INVENTOR(S) | : Yoichi Hariguchi |

It is certified that error appears in the above-identified patent and that said Letters Patent is hereby corrected as shown below:

The address in the (76) Invertor on the first page of the patent should be:
(76) Inventor: Yoichi Hariguchi, 642 Homer Ave., Palo Alto, CA (US) 94301

Signed and Sealed this

Twenty fifth Day of September, 2001

Attest:

*Attesting Officer*

NICHOLAS P. GODICI
*Acting Director of the United States Patent and Trademark Office*